United States Patent [19]

Kawamura et al.

[11] Patent Number: 5,260,107

[45] Date of Patent: Nov. 9, 1993

[54] PLASMA CHEMICAL VAPOR DEPOSITION PROCESS FOR PRODUCING A HARD MULTILAYER COATED PRODUCT

[75] Inventors: Shingo Kawamura, Asahi; Minoru Yamada, Kurobe, all of Japan

[73] Assignee: Yoshida Kogyo K.K., Tokyo, Japan

[21] Appl. No.: 861,246

[22] Filed: Mar. 31, 1992

[30] Foreign Application Priority Data

Apr. 8, 1991 [JP] Japan .................................. 3-138534

[51] Int. Cl.$^5$ .......................... B05D 3/06; C23C 16/00
[52] U.S. Cl. .................................... 427/577; 427/249;
427/255.7; 427/419.7; 428/698
[58] Field of Search ................ 427/38, 39, 249, 255.7,
427/419.7, 577; 428/698

[56] References Cited

U.S. PATENT DOCUMENTS

| | | | |
|---|---|---|---|
| 4,686,156 | 8/1987 | Baldoni, II et al. | 428/698 |
| 4,774,130 | 9/1988 | Shiro et al. | 428/216 |
| 4,984,940 | 1/1991 | Bryant et al. | 407/119 |
| 5,071,693 | 12/1991 | Sue et al. | 428/212 |
| 5,093,151 | 3/1992 | Berg et al. | 427/39 |

*Primary Examiner*—Roy King
*Attorney, Agent, or Firm*—Flynn, Thiel, Boutell & Tanis

[57] ABSTRACT

This present invention provides a hard multilayer coated product comprising a hard wear-resistant titanium compound coating layer, a titanium compound layer having a compositional gradient and a self-lubricating coating layer comprising hard amorphous carbon as the principal component successively formed on the surface of a substrate, the first layer being formed at about 500° C. by the plasma CVD method in a vacuum followed by the formation of the second and third layers at 250° to 400° C. in a vacuum maintained at the same level as above. The hard multilayer coated product is improved in wear-resistance and self-lubricity.

5 Claims, 2 Drawing Sheets

DISTANCE FROM SUBSTRATE SURFACE (μm)

PLASMA CHEMICAL VAPOR DEPOSITION PROCESS FOR PRODUCING A HARD MULTILAYER COATED PRODUCT

BACKGROUND OF THE INVENTION

1. Field of the Invention

The present invention relates to a hard multilayer coated product improved in wear resistance and self-lubricity and applicable to tools, metal molds and machine parts, and a process for producing the product.

2. Description of the Prior Art

There has heretofore been used a coating of TiC or TiN to improve the wear resistance of tools, molds and machine parts. In spite of its wear resistance, the titanium compound hard coating was poor in self-lubricity and often adhered with an active metal such as aluminum under a nonlubricating condition. On the other hand, hard amorphous carbon formed a self-lubricating hard coating but was insufficient in tight bonding to a substrate and liable to deliminate therefrom. The attempt to form a hard amorphous carbon coating on TiC or TiN was hardly successful since the coating peeled off from TiC or TiN during or immediately after the coating formation in most of the cases because of a high internal stress of the hard amorphous carbon and a poor compatibility thereof with TiC or TiN. The introduction of a layer containing TiC or other titanium compound as the intermediate layer between the hard amorphous carbon and TiC or TiN enables the laminate to be used for a light load application or an ornamental use. However, the tight bonding of the intermediate layer to the hard amorphous carbon is yet so insufficient that the laminate is impractical for an application where self-lubricity or wear resistance is required.

SUMMARY OF THE INVENTION

It is an object of the present invention to provide a hard multilayer coated product having a self-lubricant and wear-resistant coating formed on the surface of a substrate, the coating being tightly bonded and difficult to peel off.

The present invention provides a hard multilayer coated product which comprises a hard wear-resistant titanium compound coating layer, a titanium compound layer having a compositional gradient and a self-lubricating coating layer comprising hard amorphous carbon as the principal component successively formed on the surface of a substrate.

The present invention further provides a process for producing the hard multilayer coated product as mentioned above, which comprises the steps of placing a substrate in a vacuum furnace; introducing a source gas at around 500° C. into the furnace; forming a titanium compound coating layer on the substrate by the plasma CVD method; and forming a titanium compound layer having a compositional gradient and a self-lubricating coating layer comprising hard amorphous carbon as the principal component by the plasma CVD method while keeping a vacuum at a temperature of the substrate in the range of 250° to 400° C.

DETAILED DESCRIPTION OF THE PREFERRED EMBODIMENTS

Figure 1:
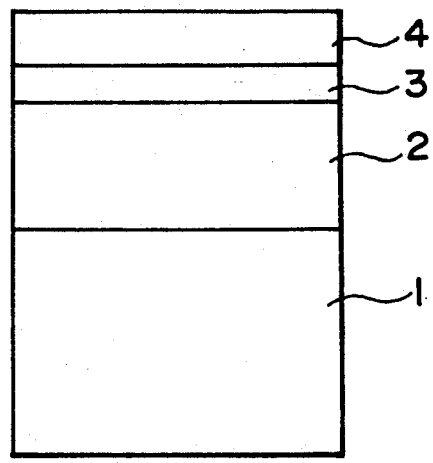
FIG. 1 is an illustrative view of the laminate constitution of the example according to the present invention.

The present invention will now be described in detail hereinafter.

In the above-mentioned multilayer coating, the titanium compound is TiC or TiN, and each of the layers is formed by the plasma CVD method, while the self-lubricating coating layer comprises hard amorphous carbon as the principal component and 5 to 40 mol % of a titanium compound such as TiC with a preferable residual chlorine content of 3 at. % or less derived from $TiCl_4$ used as the titanium source in the plasma CVD method. A residual chlorine content exceeding 5 at. % in the coating layer adversely affects the coating properties such as self-lubricity and wear resistance. A content of the titanium compound of less than 5 mol % causes a problem of poor bonding to the titanium compound layer having a compositional gradient and is impractical for the general application wherein self-lubricity or wear resistance is required, though it is sufficient for a light load or ornamental use. On the other hand, a content of the titanium compound exceeding 40 mol % excessively enhances the property of the titanium compound, thus impairing the self-lubricating function. The self-lubricating coating layer has preferably a thickness of 0.5 to 3.0 μm.

In the titanium compound layer having a compositional gradient, the content of the titanium compound gradually decreases towards the self-lubricating coating layer. The absence of the layer having a compositional gradient results in a failure to afford a practical tight bonding between the hard wear-resistant titanium compound coating layer and the self-lubricating coating layer. The layer has preferably a thickness of 0.1 to 1.0 μm.

The hard wear-resistant titanium compound coating layer comprising TiC, TiN or the like serves to impart wear resistance to the product and its thickness is preferably in the range of 0.5 to 5.0 μm.

The process for producing the aforementioned multilayer-coated product will be more specifically described.

In forming a coating layer of a titanium compound such as TiC by the plasma CVD method, a failure to adjust the amounts of $H_2(TiCl_4)$ and $CH_4$ in a carrier gas to prescribed values (0.02 or less for a $TiCl_4$ vaporizer temperature of 20° C.), that is, a failure to adjust the amount of $CH_4$ to a prescribed value generally results in the formation of graphite with poor bondability particularly at the edge of a product having a three-dimensional structure, thereby failing to sufficiently coat the edge with TiC. In addition, a coating formation temperature of lower than 500° C. results in an excessive amount of residual chlorine in the formed coating layer. A residual chlorine content of 5 at. % or more in the coating layer adversely affects the coating properties such as self-lubricity and wear-resistance.

In the course of the research, however, it has been found that the adjustment of a substrate temperature to 250° to 400° C. and that of a ratio of the flow rate of $CH_4$, or a hydrocarbon other than $CH_4$, to the flow rate of $H_2(TiCl_4)$ to 0.2 or more, in terms of the mole ratio of C in the hydrocarbon to $H_2$ in $H_2(TiCl_4)$, enable the prevention of graphite formation at the edge and, at the same time, makes it possible to form a hard amorphous carbon coating layer comprising TiC with a chlorine content of 3 at. % or less, even at a lower temperature of 250° to 400° C. Specifically, it has been found that a multilayer coating can be prepared by the process comprising the steps of initially forming a TiC coating layer at a higher temperature of around 500° C.; setting the substrate temperature at 250° to 400° C. and the ratio of the flow rate of $CH_4$, or a hydrocarbon other than $CH_4$, to the flow rate of $H_2(TiCl_4)$, to 0.2 or more, in terms of the ratio of C in the hydrocarbon to $H_2$ in $H_2(TiCl_4)$, to form a hard amorphous carbon coating layer wit a high content of TiC; gradually increasing the above-described ratio to gradually decrease the TiC content in the formed coating layer and introduce a titanium compound layer with a compositional gradient for forming a hard amorphous carbon coating layer; and finally carrying out coating formation under the condition of the TiC content of 5 to 40 mol % to continuously treat both the TiC coating layer and the hard amorphous carbon coating layer.

The formation of a TiN coating layer and, forming further thereon, a hard amorphous carbon coating layer containing a titanium compound, can be carried out in the same manner as the formation of the TiC coating layer hereinbefore described. Specifically, a multilayer coating can be produced by the process comprising the steps of initially forming a TiN coating layer at a higher temperature of around 500° C. on the surface of a substrate; setting the substrate temperature at 250° C. to 400° C. and the ratio of the flow rate of $CH_4$, or a hydrocarbon other than $CH_4$, to the flow rate of $H_2(TiCl_4)$ to 0.2 or more, in terms of the ratio of C in the hydrocarbon to $H_2$ in $H_2(TiCl_4)$; further adding a proper amount of $N_2$ to form a hard amorphous carbon coating layer with a high content of the titanium compound; gradually increasing the above-described ratio to gradually decrease the content of the titanium compound and introduce a titanium compound layer with a compositional gradient for forming a hard amorphous carbon coating layer in which the flow rate of $N_2$ may be varied; and finally carrying out coating formation under the condition of the titanium compound content of 5 to 40 mol % to continuously treat both the TiN coating layer and the hard amorphous carbon coating layer.

By the above-mentioned process, the hard amorphous carbon coating layer containing TiC or a titanium compound can be tightly bonded to the underlying TiC or TiN.

The advantage brought about by the continuous formation of the TiC or TiN layer, intermediate layer and hard amorphous carbon coating layer, while keeping a vacuum, resides in that the outermost surface of TiC or TiN is not exposed to air, and thus a hard amorphous carbon layer is formed with further enhanced tight bondability. When the TiC or TiN layer only is formed by a method other than the plasma CVD method, for example, ion plating or thermal CVD method, followed by the formation of a hard amorphous carbon coating layer containing a titanium compound by the plasma CVD method, even if the above operation is effected in a vacuum, practical tight bondability is not obtained in most of the cases because of the deteriorated compatibility between the coating layers formed by the different methods due to the properties of the coating (internal stress, surface condition, crystal grain size, etc.) which characterize the method for coating formation.

The hard amorphous carbon coating layer containing TiC or TiN according to the present invention is superior in heat resistance to the conventional hard amorphous carbon coating layer which is graphitized at about 300° C., since the coating of the present invention can be formed at a relatively high temperature (up to 400° C.) as compared with the coating formation temperature of the conventional coating of up to 200° C. and is stable even at such a high temperature.

EXAMPLE

Figure 2:
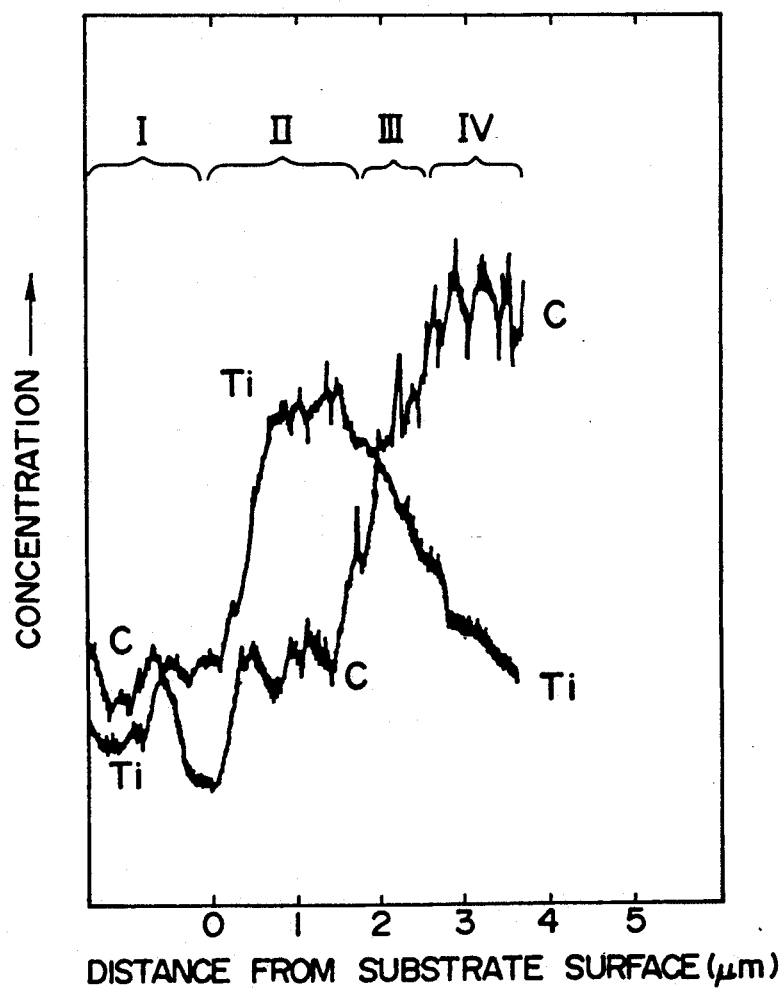
FIG. 2 is a graph showing the result of compositional analysis by EPMA (Electron Probe Micro Analysis) for the product of the example according to the present invention.
Figure 3:
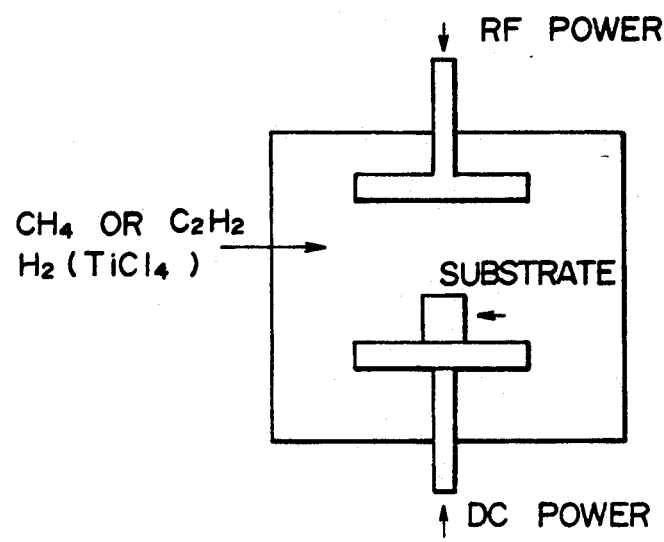
FIG. 3 is an illustrative view of the plasma CVD apparatus carrying out the present invention.

By the use of a plasma CVD apparatus as shown in FIG. 3, a substrate made of high speed steel, designated "SKH51" by Japanese Standard Association, was placed on the DC electrode side and subjected to RF discharge at a ratio of the flow rate of $CH_4$ to $H_2(TiCl_4)$ of 0.02, a pressure of 0.3 Torr while maintaining the temperature at 500° C. to form a TiC coating layer 2 of 2.0 μm thickness on the surface of the substrate 1. Subsequently, the substrate temperature was lowered to 300° C. and the ratio of the flow rate of $CH_4$ to $H_2(TiCl_4)$, in terms of $C:H_2$, was gradually increased from 0.2 to 1 by gradually decreasing the flow rate of $H_2(TiCl_4)$ to finally attain the flow rate ratio of 1 and to form a TiC layer 3 having a compositional gradient with a thickness of 0.7 μm, on which was formed a TiC-containing hard amorphous carbon coating layer 4 of 1 μm thickness. During the aforementioned procedure, the pressure was altered from 0.25 Torr to 0.05 Torr. The result of the compositional analysis of the coating thus formed by means of EPMA is given in FIG. 2. As seen from the figure, the multilayer coating was composed of the TiC coating layer II, the TiC layer III having a continuous compositional gradient of Ti and C with a gradual increase in C and a gradual decrease in Ti, and the TiC-containing hard amorphous carbon coating layer IV successively superimposed in that order on the substrate (SKH51) I.

The coating thus obtained was subjected to a scratch test. It was found that, the coating of 3.7 μm thickness had a high critical load value of 30N without causing delamination between the TiC layer and hard amorphous carbon layer. On the other hand, a single TiC coating of the same thickness had a critical load value of 23N, which demonstrates the favorable tight bonding between the TiC coating layer and the hard amorphous carbon coating layer as well as the self-lubricity of the hard amorphous carbon coating layer formed by the process of the present invention.

Figure 4:
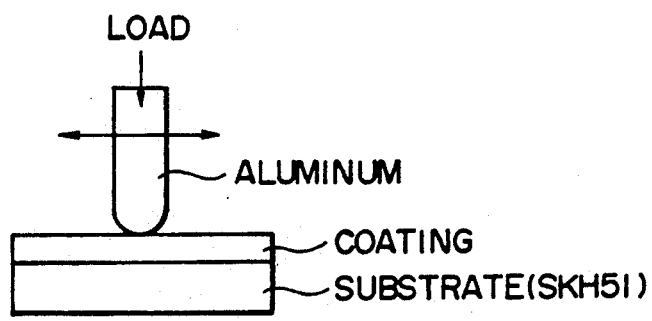
FIG. 4 is an illustrative view of the frictional wear test.

The coating thus obtained was subjected to a frictional wear test under a nonlubricating condition as shown in FIG. 4, to test the adhesion to aluminum. It was found that the hard amorphous carbon/TiC composite coating of the present invention was completely free from adhesion, even after 180 min, with the surface tested remaining unchanged, whereas the single TiN or TiC coating caused adhesion to Al after 5 min from the initiation of the test.

While, in the above Example, the high speed steel SKH 51 was used as the substrate, the multilayer coating as set forth above can be similarly applied to other articles, such as tolls, metal molds and machine parts, in which good wear-resistance and good self-lubricity are required.

The hard amorphous carbon coating layer according to the present invention is superior in heat resistance to the conventional hard amorphous carbon coating layer which is graphitized at a temperature of about 300° C. or more, since the coating layer according to the present invention can be formed at a relatively high temperature (up to 400° C.) as compared with the conventional coating formation temperature of up to 200° C. and is stable even at such a high temperature. Moreover, according to the present invention, the wear-resistance of the coating is attained with the titanium compound (TiC, TiN, etc.) coating layer as the sublayer and self-lubricity with wear-resistance is achieved with the hard amorphous carbon coating layer as the top layer, both layers being tightly bonded to each other with the least possibility of delamination.

When applied to a sliding surface of a machine part under a nonlubricating condition, the second hard wear-resistant titanium compound coating layer can prevent the adhesion of metals themselves, even if the hard amorphous carbon coating layer is worn out.

We claim:

1. A process for forming a multilayered coated product, said process comprising the steps of placing a substrate in a vacuum furnace; creating a vacuum in said vacuum furnace; contacting said substrate with a source gas containing a titanium compound at a temperature of about 500° C.; forming a titanium-containing coating layer on said substrate by plasma chemical vapor deposition; forming a second coating layer on said substrate by plasma chemical vapor deposition, said second coating layer having a titanium compositional gradient; and forming a third coating layer on said substrate by plasma chemical vapor deposition, said third coating layer being a self-lubricating layer and comprising amorphous carbon and said second and third coating layers being formed on said substrate while maintaining said vacuum in said furnace and maintaining said substrate at a temperature in a range of from 250° to 400° C.

2. The process of claim 1, wherein the second and third coating layers are formed by contacting said substrate with a feed gas comprising a hydrocarbon and a mixture of a hydrogen gas and gaseous titanium tetrachloride, said feed gas having a mole ratio of carbon in the hydrocarbon to hydrogen in the mixture of at least 0.2.

3. The process of claim 1, wherein said second and third coating layers comprise TiC or TiN.

4. The process of claim 2, wherein said third coating layer is formed by increasing the mole ratio of the carbon in the hydrocarbon to the hydrogen in the mixture.

5. The process of claim 1, wherein said third coating layer comprises amorphous carbon and 5 to 40 mol % of a titanium compound having up to 3 at. % chlorine.

* * * * *